United States Patent
Lell et al.

(10) Patent No.: US 11,196,231 B2
(45) Date of Patent: Dec. 7, 2021

(54) SEMICONDUCTOR LASER DIODE AND METHOD FOR MANUFACTURING A SEMICONDUCTOR LASER DIODE

(71) Applicant: OSRAM Opto Semiconductors GmbH, Regensburg (DE)

(72) Inventors: Alfred Lell, Maxhütte-Haidhof (DE); Sebastian Taeger, Bad Abbach (DE)

(73) Assignee: OSRAM OLED GMBH, Regensburg (DE)

( * ) Notice: Subject to any disclaimer, the term of this patent is extended or adjusted under 35 U.S.C. 154(b) by 14 days.

(21) Appl. No.: 16/500,078

(22) PCT Filed: Apr. 18, 2018

(86) PCT No.: PCT/EP2018/059905
§ 371 (c)(1),
(2) Date: Oct. 1, 2019

(87) PCT Pub. No.: WO2018/192972
PCT Pub. Date: Oct. 25, 2018

(65) Prior Publication Data
US 2020/0112142 A1    Apr. 9, 2020

(30) Foreign Application Priority Data
Apr. 20, 2017   (DE) .......................... 102017108435.5

(51) Int. Cl.
*H01S 5/22*    (2006.01)
*H01S 5/028*   (2006.01)
*H01S 5/343*   (2006.01)

(52) U.S. Cl.
CPC ............ *H01S 5/221* (2013.01); *H01S 5/0287* (2013.01); *H01S 5/222* (2013.01); *H01S 5/2227* (2013.01);
(Continued)

(58) Field of Classification Search
CPC ......... H01S 5/0287; H01S 5/222; H01S 5/221
See application file for complete search history.

(56) References Cited

U.S. PATENT DOCUMENTS 4,870,650 A * 9/1989  Mink ...................... H01S 5/227
                                                         372/45.013
6,249,534 B1   6/2001  Itoh et al.
(Continued)

FOREIGN PATENT DOCUMENTS

| CN | 1295365 A | 5/2001 |
| CN | 1411035 A | 4/2003 |

(Continued)

OTHER PUBLICATIONS

Anurag Tyagi, et. al., "AlGaN-Cladding Free Green Semipolar GaN Based Laser Diode with a Lasing Wavelength of 506.4 nm," Applied Phys. Express 3 011002, Dec. 25, 2009, 4 pages.
(Continued)

*Primary Examiner* — Tuan N Nguyen
(74) *Attorney, Agent, or Firm* — Slater Matsil, LLP

(57) ABSTRACT

A semiconductor laser diode and a method for manufacturing a semiconductor laser diode are disclosed. In an embodiment a semiconductor laser diode includes an epitaxially produced semiconductor layer sequence comprising at least one active layer and a gallium-containing passivation layer on at least one surface region of the semiconductor layer sequence.

21 Claims, 9 Drawing Sheets

(52) U.S. Cl.
CPC .... *H01S 5/34333* (2013.01); *H01S 2301/176* (2013.01)

(56) References Cited

U.S. PATENT DOCUMENTS

| | | | |
|---|---|---|---|
| 6,656,759 | B1 | 12/2003 | Nakanishi et al. |
| 6,821,805 | B1 | 11/2004 | Nakamura et al. |
| 7,084,421 | B2 | 8/2006 | Koike et al. |
| 7,794,543 | B2 | 9/2010 | Motoki et al. |
| 8,035,676 | B2 | 10/2011 | Harasaka et al. |
| 8,369,371 | B1 * | 2/2013 | Chin ............... H01S 5/0282 372/49.01 |
| 9,508,903 | B2 | 11/2016 | Fehrer et al. |
| 9,787,055 | B2 | 10/2017 | Müller et al. |
| 9,800,016 | B1 * | 10/2017 | Raring ............. H01S 5/0282 |
| 10,593,831 | B2 | 3/2020 | Takeuchi et al. |
| 2004/0007786 | A1 | 1/2004 | Kim |
| 2006/0002442 | A1 * | 1/2006 | Haberern ......... H01L 33/145 372/46.01 |
| 2006/0231850 | A1 | 10/2006 | Sakong et al. |
| 2006/0268951 | A1 | 11/2006 | Choi |
| 2008/0048196 | A1 * | 2/2008 | Strittmatter ...... H01L 33/20 257/94 |
| 2008/0241421 | A1 | 10/2008 | Chen et al. |
| 2009/0135875 | A1 * | 5/2009 | Ueda ............... B82Y 20/00 372/45.012 |
| 2016/0268951 | A1 | 9/2016 | Cho et al. |
| 2016/0372893 | A1 | 12/2016 | McLaurin et al. |

FOREIGN PATENT DOCUMENTS

| | | |
|---|---|---|
| CN | 101582562 A | 11/2009 |
| CN | 102299482 A | 12/2011 |
| CN | 102668140 A | 9/2012 |
| CN | 103326233 A | 9/2013 |
| CN | 105103392 A | 11/2015 |
| DE | 10253161 A1 | 3/2004 |
| DE | 102014105191 A1 | 10/2015 |
| EP | 0949731 A2 | 10/1999 |
| EP | 1120872 A1 | 8/2001 |
| JP | 2012134327 A | 7/2012 |

OTHER PUBLICATIONS

Xin Wang, et. al., "Study on Vacuum Cleavage Passivation Technology of GaAs Semiconductor Laser," Semiconductor Optoelectronics, vol. 35 No. 6, Dec. 2014, 12 pages.

* cited by examiner

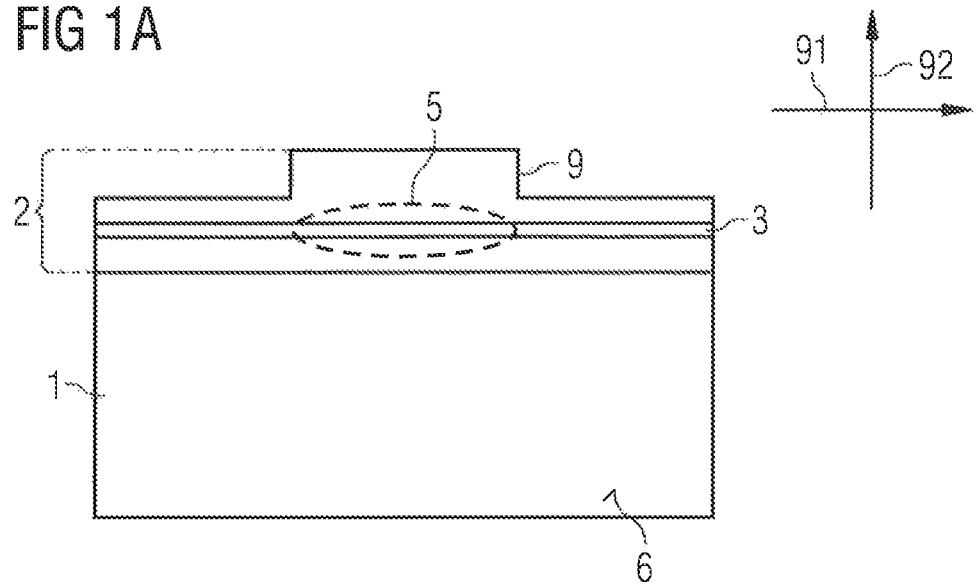
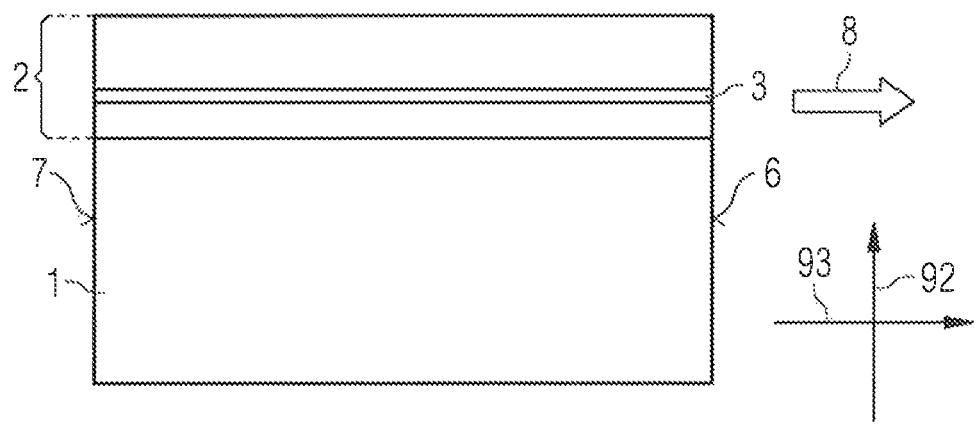

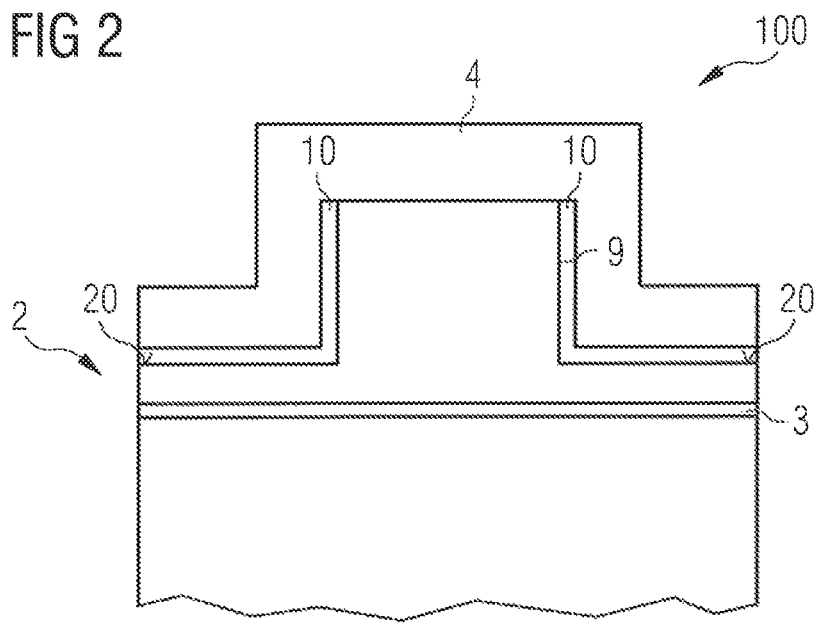
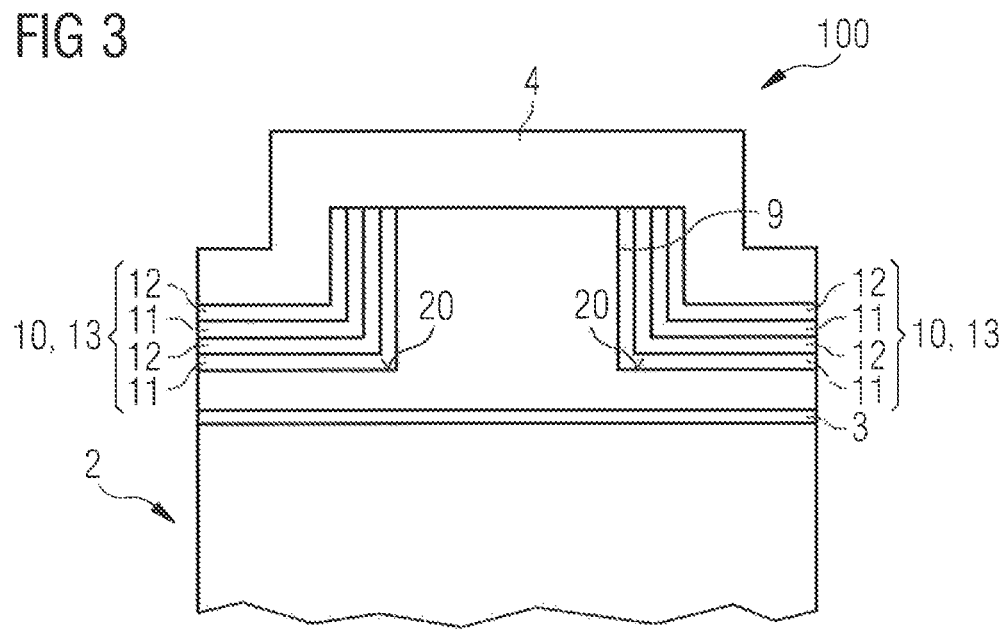

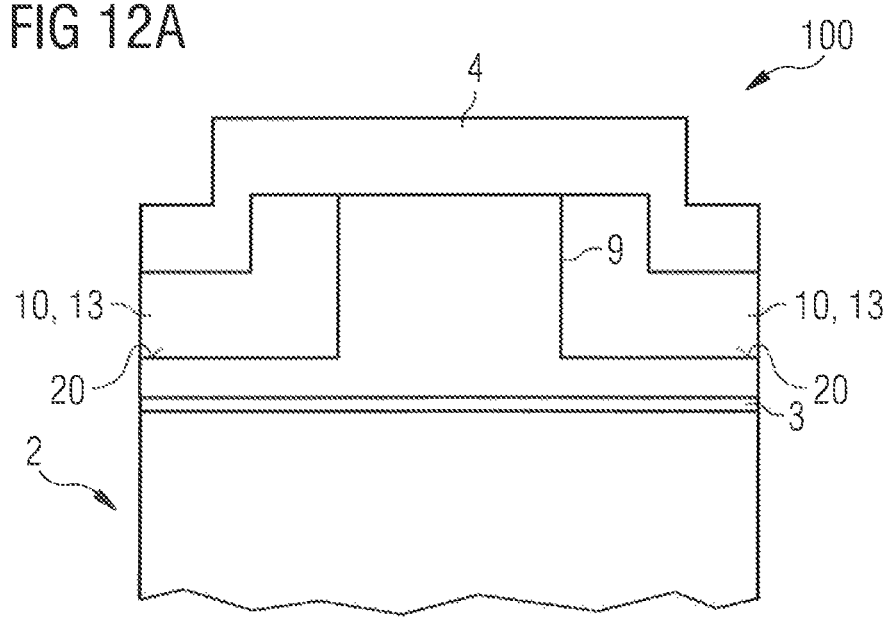
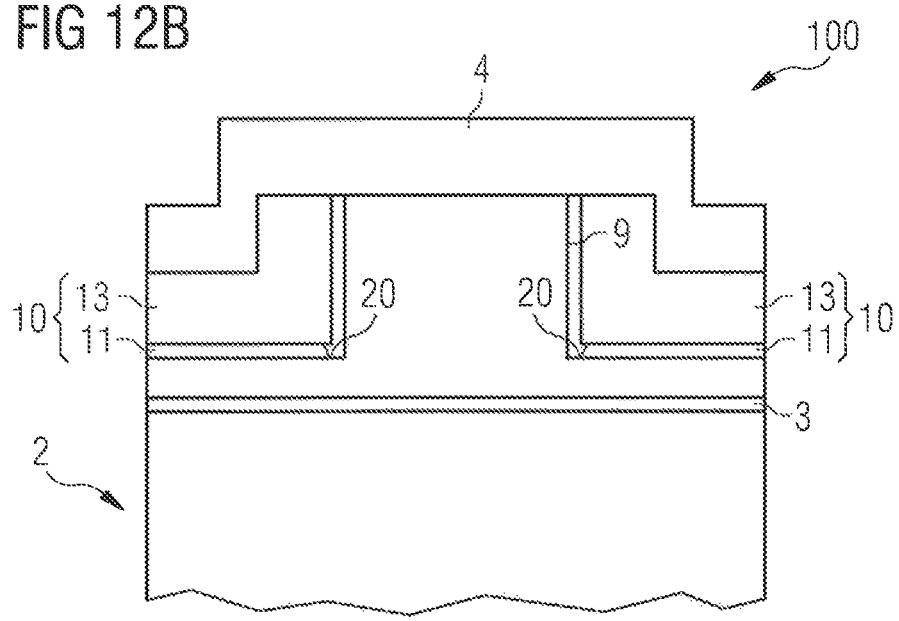

SEMICONDUCTOR LASER DIODE AND METHOD FOR MANUFACTURING A SEMICONDUCTOR LASER DIODE

This patent application is a national phase filing under section 371 of PCT/EP2018/059905, filed Apr. 18, 2018, which claims the priority of German patent application 102017108435.5, filed Apr. 20, 2017, each of which is incorporated herein by reference in its entirety.

TECHNICAL FIELD

A semiconductor laser diode and a method for manufacturing a semiconductor laser diode are specified.

BACKGROUND

Laser diodes in the spectral range from ultraviolet to infrared are increasingly opening up new markets, for example, in the field of lighting, projection and material processing applications, where they can demonstrate their advantages in terms of increased luminance, especially compared to light-emitting diodes (LEDs). Such laser diodes are substantially based on epitaxial structures in the InAlGaN, InAlGaP or InAlGaAs material system. Dielectric passivation materials such as $SiO_2$, $Si_3N_4$ or $ZrO_2$ are used as standard in chip technology production for current limitation and index guiding. However, it can be problematic that the refractive index of the passivation can only be varied within extremely narrow limits, depending on the dielectric used. In addition, these dielectric materials have a low thermal conductivity and are inadequately suited for many applications and power ranges with regard to their covering properties and shielding effect. These disadvantages can lead on the one hand to efficiency losses and on the other hand to component stability problems.

SUMMARY OF THE INVENTION

Embodiments provide a semiconductor laser diode. Further embodiments provide a method for manufacturing a semiconductor laser diode.

According to at least one embodiment, a semiconductor laser diode has at least one active layer embodied and intended to generate light in an active region during operation. In particular, the active layer can be part of a semiconductor layer sequence comprising a plurality of semiconductor layers and can have a main extension plane perpendicular to an arrangement direction of the layers of the semiconductor layer sequence. For example, the active layer can have exactly one active region. The active region can at least partly be defined by a contact surface of the semiconductor layer sequence with an electrode layer, i.e., at least partly by a surface over which current is applied into the semiconductor layer sequence and thus into the active layer. Furthermore, the active region can also be defined at least partly by a ridge waveguide structure, i.e., by a ridge formed in the semiconductor material of the semiconductor layer sequence in the form of an elongated elevation. In addition, the active layer can also have a plurality of active regions, which can be defined by a corresponding plurality of the measures described. Even though the features and embodiments described in the following mostly refer to a semiconductor laser diode with one active region in the active layer and thus possibly with one ridge waveguide structure, the following embodiments also apply accordingly to semiconductor laser diodes with a plurality of active regions in the active layer and thus possibly with a plurality of ridge waveguide structures.

According to a further embodiment, in a method for manufacturing a semiconductor laser diode an active layer is produced which is embodied and intended to generate light during operation of the semiconductor laser diode. In particular, a semiconductor layer sequence with the active layer can be produced by means of an epitaxial process. The embodiments and features described above and in the following apply equally to the semiconductor laser diode and to the method for manufacturing the semiconductor laser diode.

According to a further embodiment, the semiconductor laser diode has a light-outcoupling surface and a rear surface opposite the light-outcoupling surface. The light-outcoupling surface and the rear surface can be in particular side surfaces of the semiconductor laser diode, especially preferably side surfaces of the semiconductor layer sequence, which can also be called facets. During operation, the semiconductor laser diode can emit the light generated in the active region via the light-outcoupling surface. Suitable optical coatings, in particular reflective or partially reflective layers or layer sequences, which can form an optical resonator for the light produced in the active layer, can be applied to the light-outcoupling surface and the rear surface. The active region can extend between the rear surface and the light-outcoupling surface along a direction, which here and in the following is referred to as the longitudinal direction. The longitudinal direction can in particular be parallel to the main extension plane of the active layer. The arrangement direction of the layers on top of each other, i.e., a direction perpendicular to the main extension plane of the active layer, is referred to here and in the following as the vertical direction. A direction perpendicular to the longitudinal direction and perpendicular to the vertical direction is referred to here and in the following as the lateral direction. The longitudinal direction and the lateral direction can thus span a plane that is parallel to the main extension plane of the active layer.

The semiconductor layer sequence can in particular be embodied as an epitaxial layer sequence, i.e., as an epitaxially grown semiconductor layer sequence. The semiconductor layer sequence can be based on InAlGaN, for example. InAlGaN-based semiconductor layer sequences include in particular those in which the epitaxially produced semiconductor layer sequence generally comprises a layer sequence of different individual layers which contains at least one individual layer which comprises a material from the III-V compound semiconductor material system $In_xAl_yGa_{1-x-y}N$— with $0 \leq x \leq 1$, $0 \leq y \leq 1$ and $x+y \leq 1$. In particular, the active layer can be based on such a material. Semiconductor layer sequences that have at least one active layer based on InAlGaN can, for example, emit electromagnetic radiation in an ultraviolet to green wavelength range.

Alternatively or additionally, the semiconductor layer sequence can also be based on InAlGaP, i.e., the semiconductor layer sequence can have different individual layers, of which at least one individual layer, e.g., the active layer, comprises a material made of the III-V compound semiconductor material system $In_xAl_yGa_{1-x-y}P$ with $0 \leq x \leq 1$, $0 \leq y \leq 1$ and $x+y \leq 1$. Semiconductor layer sequences which have at least one active layer based on InAlGaP can, for example, preferably emit electromagnetic radiation with one or more spectral components in a green to red wavelength range.

Alternatively or additionally, the semiconductor layer sequence may also comprise other III-V-compound semiconductor material systems, such as an InAlGaAs-based material, or II-VI-compound semiconductor material systems. In particular, an active layer of a semiconductor laser comprising an InAlGaAs based material may be capable of emitting electromagnetic radiation having one or more spectral components in a red to infrared wavelength range. A II-VI-compound semiconductor material may have at least one element from the second main group, such as Be, Mg, Ca, Sr, and one element from the sixth main group, such as O, S, Se. For example, the II-VI compound semiconductor materials include ZnSe, ZnTe, ZnO, ZnMgO, CdS, ZnCdS and MgBe.

The active layer and, in particular, the semiconductor layer sequence with the active layer can be arranged on a substrate. For example, the substrate can be embodied as a growth substrate on which the semiconductor layer sequence is grown. The active layer and, in particular, the semiconductor layer sequence with the active layer can be produced by means of an epitaxial process, for example, by means of metal-organic vapor phase epitaxy (MOVPE) or molecular beam epitaxy (MBE). This can in particular means that the semiconductor layer sequence is grown on the growth substrate. Furthermore, the semiconductor layer sequence can be provided with electrical contacts in the form of electrode layers. Moreover, it may also be possible that the growth substrate is removed after the growth process. In this case, the semiconductor layer sequence can, for example, also be transferred to a substrate embodied as a carrier substrate after growth. The substrate may comprise a semiconductor material, such as a compound semiconductor material system mentioned above, or another material. In particular, the substrate can comprise or be made from sapphire, GaAs, GaP, GaN, InP, SiC, Si, Ge and/or a ceramic material as for instance SiN or AlN.

The active layer can, for example, comprise a conventional pn junction, a double heterostructure, a single quantum well structure (SQW structure) or a multiple quantum well structure (MQW structure) for generating light. The semiconductor layer sequence may include other functional layers and functional areas in addition to the active layer, such as p- or n-doped carrier transport layers, i.e., electron or hole transport layers, undoped or p-doped or n-doped confinement, cladding or waveguide layers, barrier layers, planarization layers, buffer layers, protective layers and/or electrode layers, and combinations thereof. Moreover, additional layers such as buffer layers, barrier layers and/or protective layers can be arranged also perpendicular to the growth direction of the semiconductor layer sequence, for instance around the semiconductor layer sequence, such as for instance on side surfaces of the semiconductor layer sequence.

According to a further embodiment, the semiconductor layer sequence has at least one ridge waveguide structure. In case the semiconductor laser diode comprises a substrate on which the semiconductor layer sequence is arranged, the ridge waveguide structure is formed in a top side of the semiconductor layer sequence opposite the substrate. Even if the semiconductor laser diode has no substrate, here and in the following the side with the ridge waveguide structure is referred to as the top side. The ridge waveguide structure can in particular be formed by a ridge-shaped, longitudinally extending elevated region of the semiconductor layer sequence. In other words, the ridge-shaped region protrudes vertically beyond the adjacent surface regions and extends in a longitudinal direction. The side surfaces delimiting the ridge waveguide structure in the lateral direction can form a step profile, especially with the adjacent surface regions of the top side of the semiconductor layer sequence. The terms "ridge-shaped region", "ridge" and "ridge waveguide structure" can be used synonymously in the following. Furthermore, the semiconductor layer sequence can also include a plurality of laterally adjacent and spaced apart ridge-shaped regions each extending in a longitudinal direction.

According to a further embodiment, the semiconductor laser diode has a passivation layer on at least one surface region of the semiconductor layer sequence. In particular, the passivation layer can be electrically insulating and thus cover the surface region electrically insulating. In addition, the passivation layer can at least partially serve as protection against damaging environmental influences. Furthermore, the passivation layer can also serve as a heat dissipation layer through which operating heat can be dissipated from the semiconductor layer sequence via the surface region. Furthermore, the passivation layer can be transparent or at least partially transparent and have a desired refractive index.

In addition, the passivation layer can be applied directly to at least one surface region of the semiconductor layer sequence. In other words, no further layer is arranged between the semiconductor layer sequence and the passivation layer, so that the passivation layer is in direct contact with the semiconductor material of the semiconductor layer sequence forming the surface region. In particular, the passivation layer can be formed by all those layers which are arranged between the surface region of the semiconductor layer sequence and an electrode layer applied above it.

According to a further embodiment, the surface region on which the passivation layer is applied comprises at least part of the top side of the semiconductor layer sequence. As described above, the top side can be a side of the semiconductor layer sequence opposite a substrate, wherein a ridge waveguide structure is not necessarily required.

In case the semiconductor laser diode has a ridge waveguide structure, the surface region can in particular comprise at least one or both lateral side surfaces of the ridge or at least part thereof. Due to the refractive index jump at the side surfaces of the ridge waveguide structure due to the transition from the semiconductor material to the passivation layer, a so-called index guidance of the light produced in the active layer can be effected, which, as described above, can decisively lead to the formation of an active region which indicates the region in the semiconductor layer sequence in which the produced light is guided and amplified in laser operation. Furthermore, the surface region can comprise the entire top side of the semiconductor layer sequence except for a contact region in which the semiconductor layer sequence is contacted from the top side by an electrode layer.

According to a further embodiment, the ridge waveguide structure is at least partially planarized by the passivation layer. In other words, the passivation layer is applied laterally to the ridge and has a thickness that is less than or preferably equal to the height of the ridge along the vertical direction, wherein the ridge height is related to the surface region of the semiconductor layer sequence laterally besides the ridge. In this case, the passivation layer can preferably form a flat surface with the ridge waveguide structure, i.e., with the top side of the ridge, so that an electrode layer can be applied to the flat surface for electrical contacting of the top side of the ridge.

Furthermore, it can also be possible that a part of the passivation layer together with the ridge waveguide structure forms a trench next to the ridge waveguide structure and that the trench is at least partially filled by another part of the passivation layer. In other words, the passivation layer can have at least a first layer formed laterally besides the ridge waveguide structure and spaced from the ridge waveguide structure. This allows a trench to be formed by means of the first layer and the ridge waveguide structure. The first layer, the trench between the first layer and the ridge waveguide structure, and a side surface of the ridge waveguide structure can be covered by a second layer of the passivation layer. In particular, the passivation layer with such a structure can be formed laterally on both sides of the ridge of the ridge waveguide structure.

According to a further embodiment, the passivation layer and the semiconductor layer sequence contain materials selected from the same compound semiconductor material system, in particular the same III-V compound semiconductor material system. The semiconductor layer sequence can preferably be based on a nitride, i.e., in particular on the above-mentioned InAlGaN material system. Accordingly, the passivation layer can also particularly preferentially comprise or be made of a nitride, in particular selected from the InAlGaN material system. Accordingly, the passivation layer can comprise or be made of at least one layer which, for example, comprises or is made of GaN or AlGaN or AlN. "GaN" and "AlN" can refer in particular to binary materials and "AlGaN" can refer in particular to a ternary material from the InAlGaN material system. The material of the passivation layer can in particular be undoped. Such materials can have a higher heat conduction coefficient, especially compared to common passivation materials such as $SiO_2$, $Si_3N_4$ and $ZrO_2$, so that the passivation layer described here can dissipate heat better than common passivation materials. The explanations above and below for nitrides also apply accordingly to the other materials mentioned above for the semiconductor layer sequence, i.e., in particular also to phosphides and arsenides, i.e., materials from the InAlGaP and InAlGaAs material system.

According to a further embodiment, the passivation layer comprises gallium. In particular, the passivation layer can comprise or be made of GaN and/or AlGaN. Furthermore, the passivation layer can also comprise AlN. The passivation layer can, for example, be formed by a single layer which comprises gallium, i.e., which, in particular, comprises or is made of GaN or AlGaN. Alternatively, the passivation layer can also comprise at least two or more layers, at least one of the layers comprising gallium, i.e., at least one layer preferably comprising or being made of GaN or AlGaN. Particularly preferably, all layers of the passivation layer can comprise or be made of a nitride, i.e., particularly preferably GaN and/or AlGaN and/or AlN. In order to achieve the desired properties of the passivation layer, such layers can be combined with specifically selected thicknesses and compositions to form the passivation layer. In the case of AlGaN, for example, the composition can vary along the thickness of the passivation layer or the thickness of at least one layer of the passivation layer.

According to a further embodiment, the passivation layer comprises a stack of at least two layers whose materials are different and which are selected from GaN, AlGaN and AlN. For example, the passivation layer can have or be made of a stack of layers with at least one layer with or made of GaN and at least one layer with or made of AlN. Several such pairs of layers are also possible, i.e., a plurality of layers with or made of GaN and a plurality of layers with or made of AlN, which are applied alternately to each other. In this case, the layer stack can also be referred to as laminate or nanolaminate. The layers of the layer stack or at least the layers with the same materials can have the same thickness. Furthermore, layers with different materials and/or layers with the same materials can have different thicknesses. Ba means of a specific selection of the number, the materials and the thicknesses of the layers of the passivation layer the refractive index of the passivation layer can be adjusted in the desired way and better than with conventional passivation materials such as $SiO_2$, $Si_3N_4$ or $ZrO_2$.

According to a further embodiment, the passivation layer has a varying refractive index. For example, the refractive index can vary along the longitudinal direction. This can be achieved, for example, by varying the material composition and/or layer composition along the longitudinal direction, i.e., in the direction of emission, and/or by varying the layer thicknesses in the longitudinal direction. Furthermore, the refractive index can vary in the direction of the thickness of the passivation layer, i.e., in a direction that faces away from the surface region, especially perpendicularly. This can be achieved by varying the material composition and/or coating composition along the thickness direction and/or by varying the coating thicknesses. A varying refractive index can improve laser parameters such as the mode behavior or the far field.

According to a further embodiment, the passivation layer is deposited by atomic layer deposition on at least one surface region. In the case of a multi-layer passivation layer, in particular all layers of the passivation layer are applied by atomic layer deposition. In the process of atomic layer deposition (ALD), a layer formation is made possible by a chemical reaction of at least two starting materials or compounds provided in gaseous form ("precursor"). In contrast to conventional chemical vapor deposition, in which the starting materials are fed simultaneously, in atomic layer deposition the starting compounds are fed cyclically one after the other into a reaction chamber. First, a first of the at least two gaseous starting compounds is fed to the volume of the reaction chamber in which the passivation layer is produced. The first starting compound can adsorb on at least one surface region. In particular, it can be advantageous if the molecules of the first starting compound adsorb irregularly and without a long-range order on the surface region and thus form an at least partially amorphous covering. After a preferably complete or nearly complete covering of the at least one surface region with the first starting compound, a second of the at least two starting compounds can be supplied. The second starting compound can react with the first starting compound adsorbed on the surface region, wherein a submonolayer or at most a monolayer of the material of the passivation layer can be formed. The first starting compound is then supplied again, which can deposit on the formed submonolayer or monolayer and, if necessary, on any remaining areas of at least one surface region. A further feed of the second starting compound can produce a further sub-monolayer or monolayer. Between the gas feeds of the starting compounds, the reaction chamber can be purged with a purging gas, in particular an inert gas such as argon or nitrogen, so that there is advantageously no previous starting compound in the reaction chamber before each feeding of a starting compound. In this way, the partial reactions can be clearly separated from each other and can be limited to the at least one surface region. An essential feature of atomic layer deposition is thus the self-limiting character of the partial reaction, which means that the starting compound of a partial reaction does not react with itself or with ligands of itself, which limits the layer growth of a partial reaction to a maximum of one monolayer of the passivation material on the at least one surface region, even with an arbitrarily long time and amount of gas.

As an alternative to the time separation of the feed of the starting compounds described above, they can also be fed in different regions in a coating room, e.g., the coating chamber. This allows spatially separated reaction regions to be achieved as the coating chamber is divided into at least two regions with different starting compounds separated by regions continuously purged with inert gas. The coating is carried out by moving the at least one surface region to be coated through these regions one after the other. For example, an arrangement in a circle is possible, so that several coating cycles can be achieved by rotating the surface to be coated through the zones with the different starting compounds. Alternatively, a linear arrangement of the zones with the various starting compounds is also possible, through which the at least one surface region to be coated is moved back and forth several times.

The passivation layer or at least one layer of the passivation layer can be applied by means of atomic layer deposition with a thickness of greater than or equal to 1 nanometer or greater than or equal to 5 nanometers or greater than or equal to 10 nanometers and less than or equal to 1 µm or less than or equal to 500 nm or less than or equal to 100 nm or less than or equal to 50 nm. The thickness of the passivation layer and, in the case of a passivation layer formed by several layers, the thickness of the individual layers of the passivation layer can in particular be chosen so that the passivation layer has a desired refractive index. Especially in the case that the passivation layer is applied to at least one side surface of the ridge of the ridge waveguide structure, the previously described index guidance can be specifically adapted.

According to a further embodiment, the passivation layer has a lower crystallinity than all layers of the semiconductor layer sequence. In particular, the passivation layer can be partly crystalline or particularly predominantly or completely amorphous. In contrast, the epitaxially grown semiconductor layer sequence can be formed from semiconductor layers that are particularly preferably completely crystalline. The term "completely crystalline" also includes layers with lattice defects such as vacancies or dislocations. Crystalline, partly crystalline and amorphous layers can be distinguished by X-ray diffraction, for example. For example, using ALD at moderate temperatures, i.e., temperatures of less than or equal to 500° C. and preferably less than or equal to 300° C., nitrides and/or gallium-containing materials can be produced partly crystalline or even amorphous.

According to a further embodiment, an electrode layer is partially applied to the passivation layer. In particular, the electrode layer can comprise or be made of a metal, a metal compound, an alloy or mixtures or layer combinations thereof. In particular, the electrode layer is also applied to a surface region of the semiconductor layer sequence that is free of the passivation layer, so that the semiconductor layer sequence can be electrically contacted by means of the electrode layer. It is particularly preferred when the passivation layer adjacent to the electrode layer has a layer containing GaN or AlGaN, as metals adhere well to these materials.

In regard to the semiconductor laser diode described here and the method for manufacturing the semiconductor laser diode, additional features and advantages described in the following can result in addition to or in combination with the features and embodiments described above. For example, atomic layer deposition makes it possible to deposit an electrically insulating, transparent, preferably highly thermally conductive passivation layer from a material based on a III-V compound semiconductor material such as GaN, AlGaN and/or AlN. In addition, the passivation layer can comprise or be formed by a layer stack, which can also be denoted as nanolaminate and which is formed by several, a few nanometers thick layers of AlN and GaN, for example, AlN/GaN/AlN/GaN/ . . . . A desired refractive index can be set via the respective layer thickness and the respective material of the individual layers. By varying the material and/or layer thickness distribution within the layer stack, gradual refractive index gradients can also be set, with which the optical wave guidance in the semiconductor layer sequence can be set very flexibly. This allows mode distributions and far field distributions as well as the kink behavior of the semiconductor laser diode to be significantly improved. The described passivation layer can also have the advantage of high thermal conductivity, good overmolding properties and high protection against environmental influences such as moisture, ozone, oxygen, sulphur, etc. Furthermore, it can also be possible to apply layers of the passivation layer only partially along the resonator, for example, in order to contribute to a widening of the optical mode in the region of a laser facet and thus to increase the facet load limit.

Since the passivation layer is preferably made of the same material system as the semiconductor layer sequence, but has a lower crystallinity as described above, a reduction in mechanical stress between the ridge waveguide structure and the passivation, in particular on the ridge side surfaces, can be achieved with advantage in comparison with conventional passivations, because stress can be reduced via the grain boundaries, for example, of a partly crystalline layer. This results in the advantage that no cracks are induced in the semiconductor layer sequence and the passivation layer does not peel off. Correspondingly manufactured components show improved optical efficiencies and an improved service life. The degree of crystallinity of the passivation layer can vary within a layer or from layer to layer. For example, coating parameters such as temperature can be selected so that one or more layers or a region of the passivation layer near the ridge waveguide structure have a higher degree of crystallinity than one or more layers or a region of the passivation layer further away from the ridge waveguide structure. This ensures that there is no mixing of atoms of the ridge waveguide structure and the passivation layer during laser operation, resulting in improved efficiency and lifetime of the semiconductor laser diode. Furthermore, for example, one or more uppermost layers or a part thereof close to or adjacent to an electrode layer can also have a higher degree of crystallinity than one or more layers or a part below these, which may, for example, reduce the penetration of metal atoms of the electrode layer and/or moisture, oxygen, sulphur or other environmental influences.

BRIEF DESCRIPTION OF THE DRAWINGS

Further advantages, advantageous embodiments and further developments are revealed by the embodiments described below in connection with the Figures, in which:

FIGS. 1A to 1E show schematic illustrations of semiconductor layer sequences for semiconductor laser diodes and of methods for manufacturing semiconductor laser diodes according to several embodiments;

FIG. 2 shows a schematic illustration of a semiconductor laser diode, in particular also in the context of a method for manufacturing the semiconductor laser diode, according to a further embodiment; and FIGS. 3 to 13B show schematic illustrations of semiconductor laser diodes, in particular also in the context of methods for manufacturing the semiconductor laser diodes, according to further embodiments.

Figure 1C:
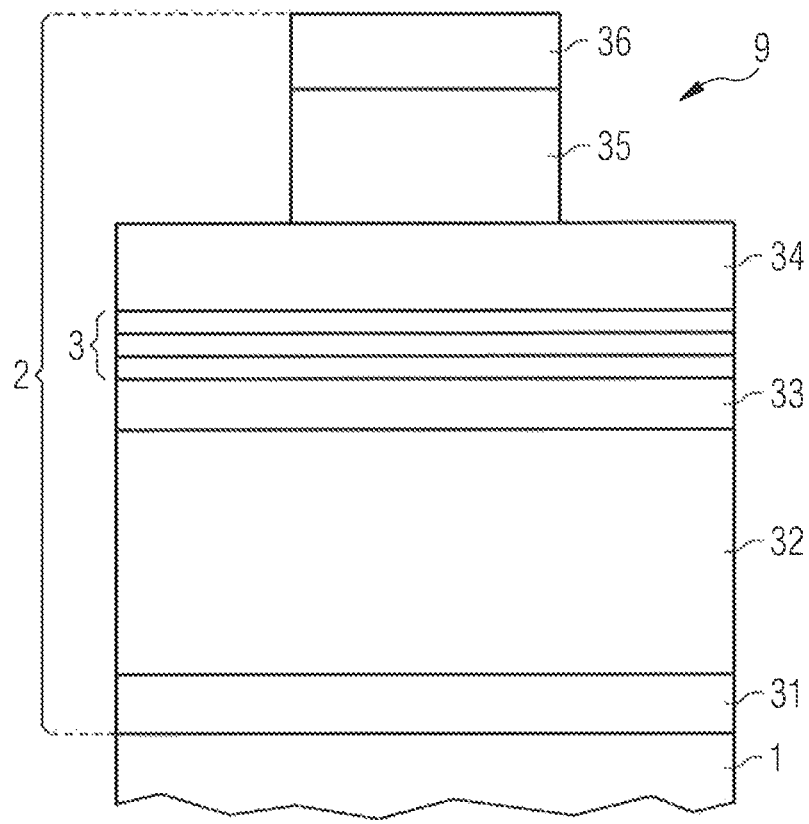

In the embodiments and Figures, identical, similar or identically acting elements are provided in each case with the same reference numerals. The elements illustrated and their size ratios to one another should not be regarded as being to scale, but rather individual elements, such as, for example, layers, components, devices and regions, may have been made exaggeratedly large to illustrate them better and/or to aid comprehension.

DETAILED DESCRIPTION OF ILLUSTRATIVE EMBODIMENTS

Figure 1D:
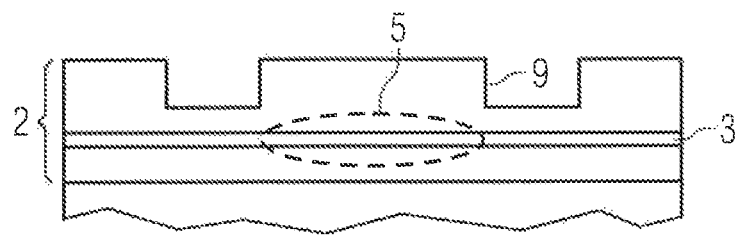
Figure 1E:
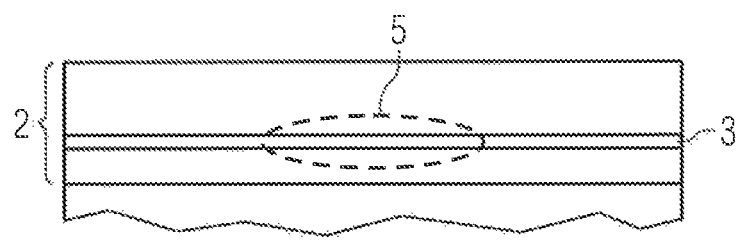

FIGS. 1A to 1E show embodiments of semiconductor layer sequences 2, each on a substrate 1, provided and used for the fabrication of the semiconductor laser diodes described below, wherein FIG. 1A shows a view onto the light-outcoupling surface 6 of the later-finished semiconductor laser diode and FIG. 1B shows a section through the semiconductor layer sequence 2 and the substrate 1 with a section plane perpendicular to the light-outcoupling surface 6. FIG. 1C shows an embodiment of the structure of the semiconductor layer sequence 2. FIGS. 1D and 1E show modifications of the semiconductor layer sequence 2.

As shown in FIGS. 1A to 1C, a substrate 1 is used which is, for example, a growth substrate for a semiconductor layer sequence 2 produced on it by an epitaxial process. Alternatively, substrate 1 can also be a carrier substrate to which a sequence of semiconductor layers 2 grown on a growth substrate is transferred after growth. For example, substrate 1 can be made of GaN on which a semiconductor layer sequence 2 based on an InAlGaN compound semiconductor material is grown. Moreover, other materials, in particular as described in the general part, are also possible for substrate 1 and semiconductor layer sequence 2. Alternatively, it is also possible that the finished semiconductor laser diode is free of a substrate. In this case, the semiconductor layer sequence 2 can be grown on a growth substrate which is subsequently removed. The semiconductor layer sequence 2 has an active layer 3, which is suitable for generating light 8 during operation of the finished semiconductor laser diode, especially when the laser threshold laser light is exceeded, and for emitting the light via the light-outcoupling surface 6.

As indicated in FIGS. 1A and 1B, here and in the following the lateral direction 91 is a direction parallel to a main extension direction of the layers of the semiconductor layer sequence 2 when viewed onto the light-outcoupling surface 6. The arrangement direction of the layers of the semiconductor layer sequence 2 on top of each other and of the semiconductor layer sequence 2 on the substrate 1 is referred to here and in the following as the vertical direction. The direction perpendicular to the lateral direction 91 and to the vertical direction 92, which corresponds to the direction along which the light 8 is emitted during operation of the finished semiconductor laser diode, is here and in the following referred to as the longitudinal direction 93.

A ridge waveguide structure 9 is formed in the top side of the semiconductor layer sequence 2 facing away from the substrate 1 by removing a part of the semiconductor material from the side of the semiconductor layer sequence 2 facing away from the substrate 1. The ridge waveguide structure 9 extends along the longitudinal direction 93 and is delimited in the lateral direction 91 on both sides by side surfaces. Due to the refractive index jump at the side surfaces of the ridge waveguide structure 9 to an adjacent material, a so-called index guidance of the light generated in the active layer 3 can be effected, which can lead decisively to the formation of an active region 5, which indicates the region in the semiconductor layer sequence 2 in which the generated light is guided and amplified in laser operation.

In addition to the active layer 3, the semiconductor layer sequence 2 can comprise further semiconductor layers, such as buffer layers, cladding layers, waveguide layers, barrier layers, current spreading layers and/or current limiting layers. As shown in FIG. 1C, the semiconductor layer sequence 2 on substrate 1 can, for example, have a buffer layer 31, there above a first cladding layer 32 and there above a first waveguide layer 33, on which the active layer 3 is applied. A second waveguide layer 34, a second cladding layer 35 and a semiconductor contact layer 36 can be applied over the active layer 3. In the embodiment shown, the second cladding layer 35 and the semiconductor contact layer 36 form the ridge waveguide structure 9. However, it can also be possible that the ridge waveguide structure 9 has a smaller or larger height, i.e., that less or more material is removed to form the ridge waveguide structure 9. For example, the ridge waveguide structure 9 can only be formed by the semiconductor contact layer 9 or by the semiconductor contact layer 36 and a part of the second cladding layer 35.

If the semiconductor layer sequence 2 as described above is based on an InAlGaN compound semiconductor material, the buffer layer 31 can comprise or be made of undoped or n-doped GaN, the first cladding layer 32 can comprise or be made of n-doped AlGaN, the first waveguide layer 33 can comprise or be made of n-doped GaN, the second waveguide layer 34 can comprise or be made of p-doped GaN, the second cladding layer can comprise or be made of p-doped AlGaN and the semiconductor contact layer 36 can comprise or be made of p-doped GaN. For example, Si can be used as an n-dopant, Mg as a p-dopant. The active layer 3 can be formed by a pn junction or, as indicated in FIG. 1C, by a quantum well structure with a number of layers formed by alternating layers with or made of InGaN and GaN. For example, the substrate can comprise or be made of n-doped GaN.

Furthermore, reflective or partially reflective layers or layer sequences which are not shown in the Figures for the sake of clarity and which are provided and arranged for the formation of an optical resonator in the semiconductor layer sequence 2 can be applied to the light-outcoupling surface 6 and the opposite rear side surface 7, which form side surfaces of the semiconductor layer sequence 2 and of the substrate 1.

As shown in FIG. 1A, for example, the ridge waveguide structure 9 can be formed by completely removing the semiconductor material laterally on both sides of the ridge. Alternatively, a so-called "tripod" can also be formed, as indicated in FIG. 1D, in which the semiconductor material is removed laterally to the ridge only along two channels to form the ridge waveguide structure 9. Alternatively, the finished semiconductor laser diode can also be embodied as a so-called broad-stripe laser diode, in which the semiconductor layer sequence 2 is produced and prepared for the further process steps without a ridge waveguide structure. Such a semiconductor layer sequence 2 is shown in FIG. 1E.

The further method steps and embodiments are explained purely by way of example using a semiconductor layer sequence with a ridge waveguide structure 9, as shown in FIGS. 1A to 1C. Alternatively, the following method steps and embodiments are also possible for the variants of the semiconductor layer sequence shown in FIGS. 1D and 1E.

The detailed structure of the semiconductor layer sequence shown in FIG. 1C is not restrictive and is not shown in the following Figures for the sake of clarity.

FIG. 2 shows a portion of a semiconductor laser diode 100 with a semiconductor layer sequence 2, wherein the semiconductor layer sequence 2 is manufactured in the course of manufacturing the semiconductor laser diode 100 in a first method step as described above and is provided for the further method steps. In a further method step, a passivation layer 10 is applied to a surface region 20.

The surface region 20 on which the passivation layer 10 is applied comprises at least part of a top side of the semiconductor layer sequence 2. The top side can in particular be a side of the semiconductor layer sequence 2 opposite a substrate. As shown in FIG. 2, the surface region 20 comprises both side surfaces of a ridge of the ridge waveguide structure 9. The passivation layer 10 is particularly transparent and has a suitable refractive index. Due to the refractive index jump at the side surfaces of the ridge waveguide structure 9 due to the transition from the semiconductor material to the passivation layer 10, an index guidance of the light generated in the active layer 3 can be effected, which can significantly lead to the formation of the active region. In particular, in the embodiment shown, the surface region 20 comprises the entire top side of the semiconductor layer sequence 2 except for a contact area in which the semiconductor layer sequence 2 is contacted from the top side by an electrode layer 4. The contact area is formed by the ridge top side of the ridge waveguide structure 9.

The passivation layer 10 comprises a material selected from the same material system as the semiconductor layer sequence 2. In the previously described case of an InAlGaN compound semiconductor material system for the semiconductor layer sequence 2, this means in particular that the material of the passivation layer 10 comprises a nitride and, particularly preferably, is at least one nitride. Furthermore, the material of the passivation layer comprises 10 gallium. The passivation layer 10 therefore preferably comprises or is made of GaN or AlGaN. In particular, the material of the passivation layer 10 is undoped.

The passivation layer 10, which is applied directly to the surface region 20 of the semiconductor layer sequence 2, is produced by atomic layer deposition. At temperatures of less than or equal to 500° C. and preferably of less than or equal to 300° C., the material of the passivation layer 10 can be applied at least partly crystalline and particularly preferably amorphous. The passivation layer 10 thus has a lower crystallinity than all layers of the semiconductor layer sequence 2, so that the passivation layer 10 can be distinguished from the layers of the semiconductor layer sequence 2 by X-ray diffraction, for example. The passivation layer 10 is particularly electrically insulating. This avoids current spreading by the passivation layer 10 with a simultaneous suitability for optical wave propagation, which can result in advantages with regard to low leakage currents and a high mirror load limit.

The passivation layer 10 can be applied with a thickness greater than or equal to 1 nanometer or greater than or equal to 5 nanometers or greater than or equal to 10 nanometers and less than or equal to 1 µm or less than or equal to 500 nm or less than or equal to 100 nm or less than or equal to 50 nm, depending on the desired optical properties. Furthermore, the passivation layer 10 can serve to protect the semiconductor layer sequence 2, i.e., in particular the active layer 3 as well as other layers such as waveguide layers, from damaging external influences such as moisture, ozone, oxygen and sulphur, for example, in sulphur-containing compounds, since the passivation layer 10 can be highly dense due to the production by atomic layer deposition. In comparison, the usual passivation materials, typically applied by evaporation, sputtering or a CVD process, often provide only limited protection of the semiconductor layers against environmental influences due to their porous character. Furthermore, a high stability of the surface of the ridge waveguide structure 9 can be achieved in laser operation, since the surface region 20 can be overmolded very well by means of atomic layer deposition compared to the other typically used processes.

In a further method step, an electrode layer 4 is applied to the ridge waveguide structure 9, i.e., in particular to the ridge top side, and to the passivation layer 10, in order to electrically contact the top side of the semiconductor layer sequence 2. For example, electrode layer 4 can comprise one or more of the metals Ag, Al, Au, Pt, Pd or ITO in the form of a single layer or in a stack of layers. The semiconductor laser diode 100 can have an additional electrode layer for electrical contacting of the other side of the semiconductor layer sequence 2, which is not shown for reasons of clarity. By choosing the material of the passivation layer 10, in particular GaN or AlGaN, a good adhesion of the electrode layer 4 on the passivation layer 10 can be achieved. Especially when mounting the semiconductor laser diode 100 with the electrode layer 4 on a heat sink, which can also be referred to as "p-down" mounting with regard to the layer structure of the semiconductor layer sequence 2 according to FIG. 1C, good heat dissipation can result from the passivation layer 10. In particular, the heat dissipation through the passivation layer 10 described here can be better than in the case of other common passivation materials such as $SiO_2$, $Si_3N_4$ and $ZrO_2$, which are poor heat conductors. Therefore, with conventional passivation materials, operation, especially at higher operating currents, can lead to increased heating of the laser diode, which can result in efficiency losses with conventional laser diodes on the one hand and an increased risk due to poor component stability on the other hand.

In connection with the following Figures, embodiments are described which represent further developments and modifications of the embodiment shown in FIG. 2. The description of the following embodiments therefore mainly refers to the differences to the embodiments already described. In particular, the following embodiments comprise the advantages described above.

FIG. 3 shows an embodiment of a semiconductor laser diode 100 in which the passivation layer 10 is formed by a stack of layers 13 with first layers 11 and second layers 12. Layer stack 13 can also be referred to as nanolaminate, in which the individual layers 11, 12 preferably have thicknesses greater than or equal to 1 nm or greater than or equal to 5 nm or greater than or equal to 10 nm and less than or equal to 100 nm or less than or equal to 50 nm. Two pairs of layers, each with a first layer 11 and a second layer 12, are shown purely as examples. Alternatively, the passivation layer 10 can also have fewer or more layers or layer pairs. The first and second layers 11, 12 are layers with AlN and GaN, respectively, so that the layer stack 13 shown is an AlN/GaN/AlN/GaN laminate, the layer stack 13 preferably having a layer with GaN adjacent to the electrode layer 4 due to the good adhesion properties of metal thereon. By using AlN the heat conduction can be improved.

The refractive index of the passivation layer 10 can be selectively adjusted via the number of layers 11, 12 and their respective thicknesses, which can be the same or different, and thus also via the thickness of the passivation layer 10, in order to be able to specifically form the waveguiding properties of the ridge waveguide structure 9. In comparison, the refractive index of conventional laser diodes with conventional dielectrics as passivation materials is determined by the choice of dielectric. A changed wave guidance via a variation of the refractive index is therefore only possible in conventional laser diodes by an exchange of the dielectric. A modified dielectric, however, changes not only the refractive index but also other component properties, such as the adhesion of the dielectric to the semiconductor, the adhesion of the electrode layer to the dielectric, the dielectric strength and the diffusion barrier properties with respect to moisture, oxygen, sulfur, etc.

Figure 4:
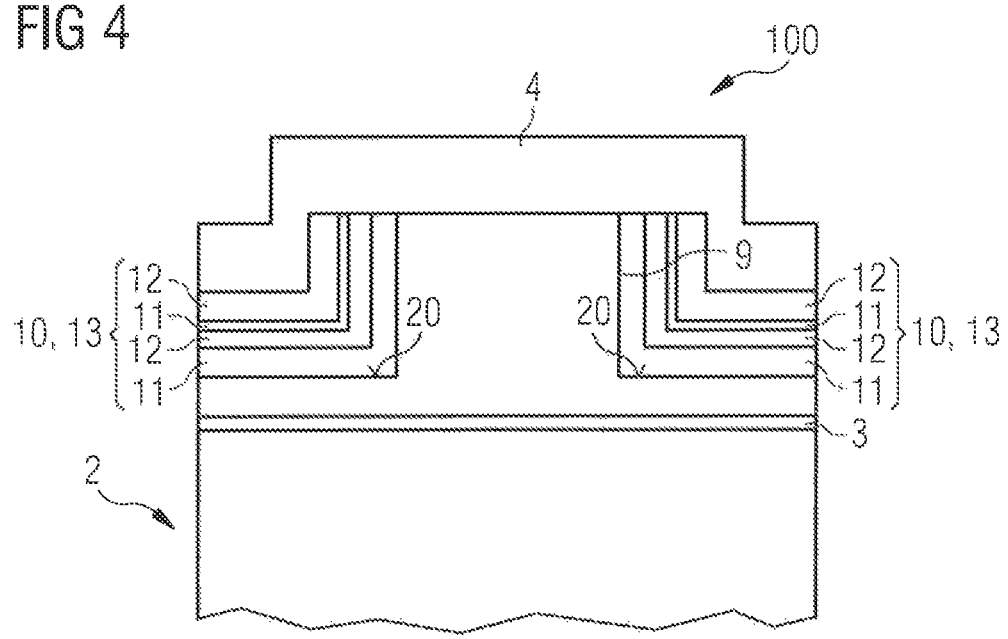

FIG. 4 shows an embodiment of a semiconductor laser diode 100 in which, compared to the previous embodiment, the refractive index along the direction of the thickness of the passivation layer 10 is varied by a varying layer thickness ratio of the thicknesses of the first and second layers 11, 12 to each other. In the embodiment shown, the layer thickness of the first 11 layers is reduced along a direction away from the surface region. Accordingly, a refractive index curve can be set over the layer thickness of the passivation layer 10. This allows the mode behavior, the far-field properties and the kink behavior to be controlled.

Figure 5:
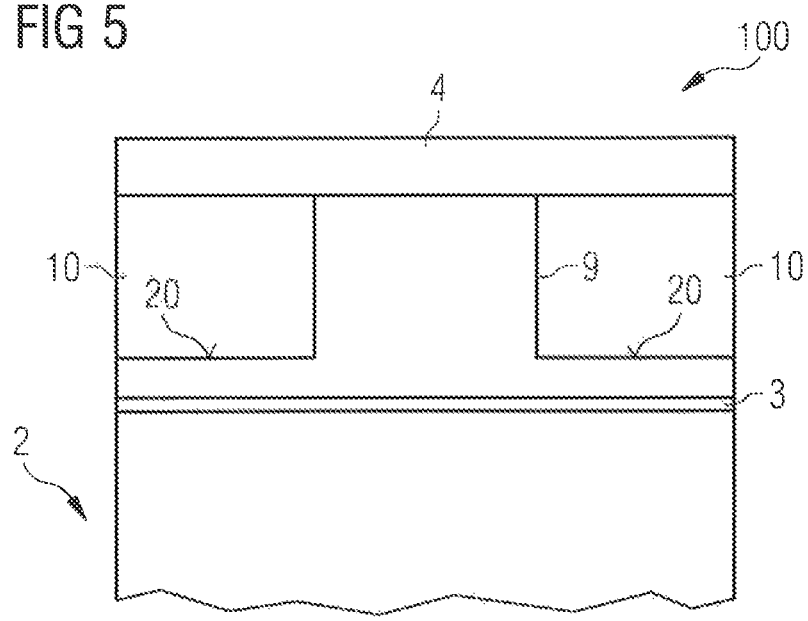

FIG. 5 shows another embodiment of a semiconductor laser diode 100 in which the passivation layer 10 planarizes the ridge waveguide structure 9. The passivation layer 10 can be single-layer or multi-layer as described in connection with the other embodiments. In particular, the passivation layer 10 may, for example, comprise or be composed of a stack of layers as described in FIGS. 3 and 4. As in the previous embodiments, the passivation layer 10 is applied to the ridge side surfaces and laterally next to the ridge of the ridge waveguide structure 9 and has a thickness equal to the height of the ridge in the vertical direction, the ridge height being related to the surface region of the semiconductor layer sequence 2 laterally next to the ridge. The passivation layer 10 thus preferably forms a flat surface with the ridge waveguide structure 9, i.e., with the ridge top side, so that, for electrical contacting of the semiconductor layer sequence 2, the electrode layer 4 can be applied to the flat surface and thus lies flat above the semiconductor layer sequence 2. This improves the mounting properties of the semiconductor laser diode 100 when mounted with the electrode layer 4 on a heat sink. The passivation layer 10 in the other embodiments can also be designed in such a way that the ridge waveguide structure 9 is planarized completely, as in the embodiment of FIG. 5, or alternatively at least partially.

Figure 6:
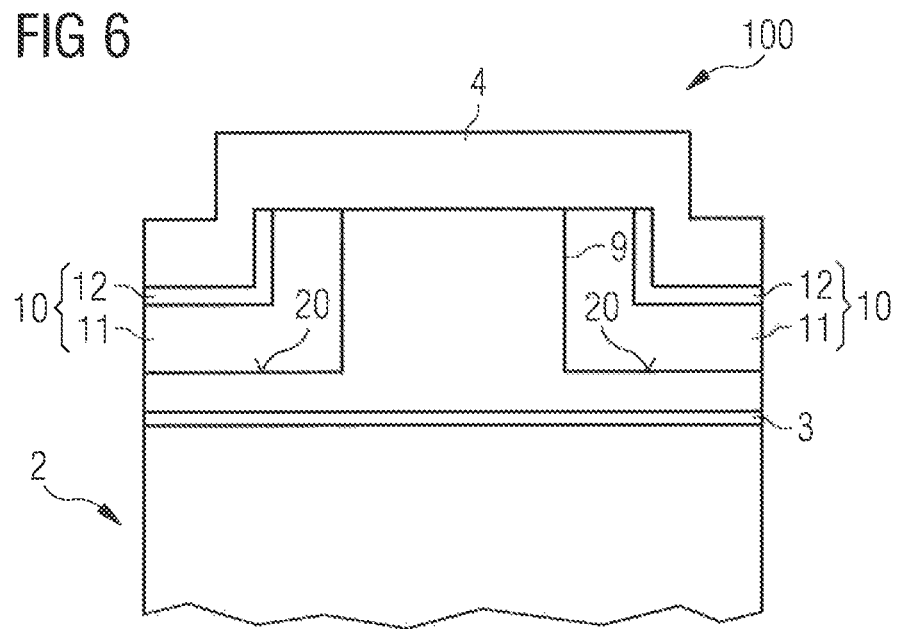

FIG. 6 shows another embodiment of a semiconductor laser diode 100 in which the passivation layer 10 has a first layer with or made of AlN that is so thick that, as shown, the ridge waveguide structure 9 is at least partially planarized. The AlN ensures very good thermal conductivity of the passivation layer 10. In order to achieve good adhesion of electrode layer 4 to passivation layer 10, passivation layer 10 can additionally comprise, as shown in FIG. 6, a second layer 12 comprising or consisting of GaN or AlGaN. Alternatively, a layer stack as described in connection with FIGS. 3 and 4 can be applied to the first layer 11.

Figure 7:
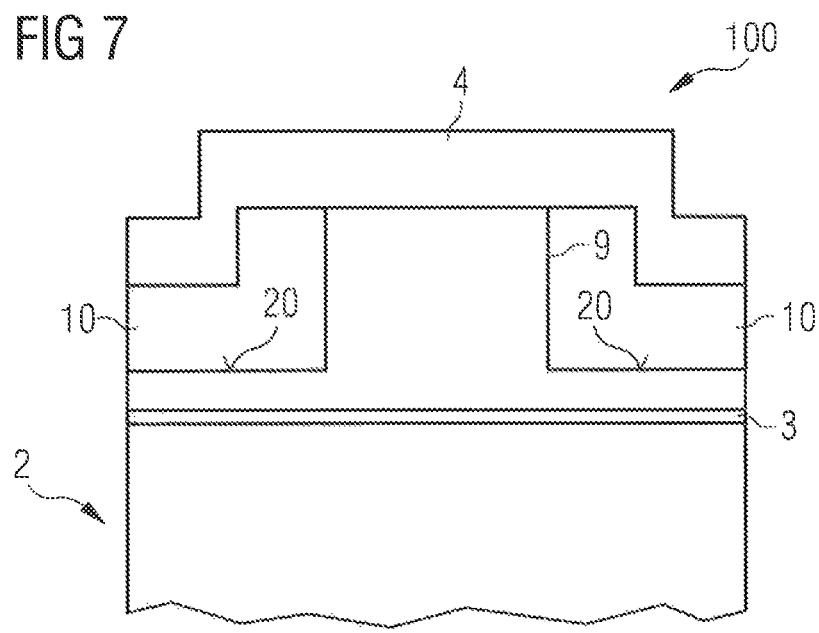

The semiconductor laser diode 100 according to the embodiment of FIG. 7 has a passivation layer 10 with or preferably made of AlGaN. The refractive index of the passivation layer 10 can be defined by the composition of the ternary material, which can also be varied during growth using ALD. As in the other embodiments, a separation of the electrical and optical guiding, i.e., the electrical and optical confinement, can thus be achieved since the passivation layer 10 permits optical penetration, but at the same time has an electrically blocking effect.

The passivation layer 10 can have a homogeneous composition or a varying composition as described above. By means of the latter, in particular a gradually varying ternary AlGaN composition, a refractive index gradient can be achieved, for example, from a higher refractive index near the surface region 20 to a lower refractive index near the side of the passivation layer 10 remote from the semiconductor layer sequence 2. The transition from a high to a low refractive index can take place continuously and without abrupt jumps, resulting in a "smooth" waveguiding. This can have an effect on an improved kink behavior. At the same time, good heat dissipation can be achieved as with the other embodiments.

Figure 8:
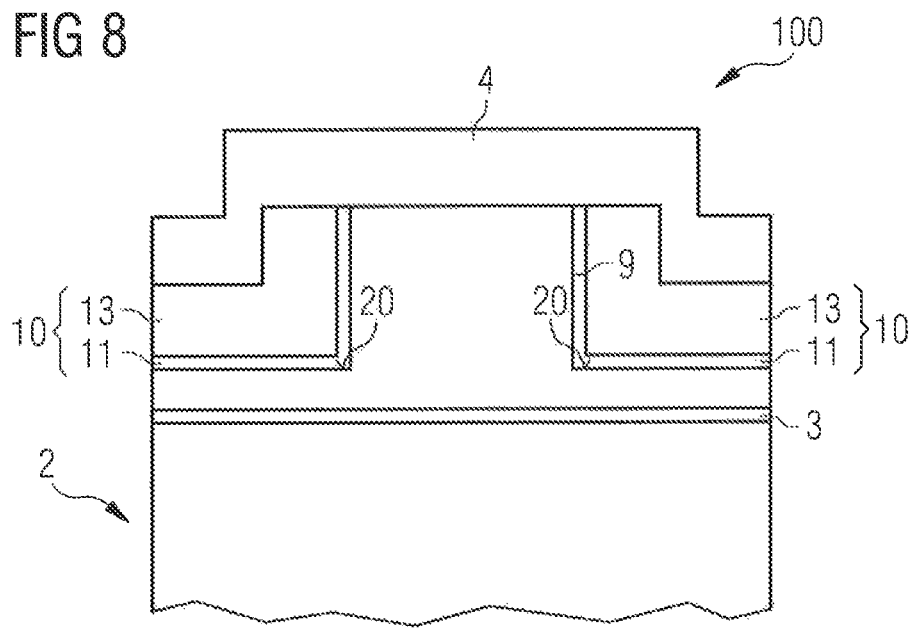

FIG. 8 shows an embodiment of a semiconductor laser diode 100 in which the passivation layer 10 has a first layer 11 with or preferably made of AlN on which a layer stack 13 or one or more layers, for example, as described in conjunction with the previous Figures, is applied. For example, the layer stack 13 can comprise or be made of an AlN/GaN layer stack, an AlGaN/AlN layer stack, a GaN/AlGaN layer stack or alternatively an AlGaN layer. Here and in the following the terms "X/Y layer stack" or "X/Y laminate" mean that the layer stack comprises at least one or more layers with or made of the material "X" and at least one or more layers with or made of the material "Y" applied alternately on top of each other.

The first layer 11 has a relatively small thickness, preferably of a few nanometers, and serves as a protective layer which, due to its small thickness, can have little influence on the wave guidance. In particular, the first layer 11 can offer protection against material mixing for the surface region 20 and thus for the surface of the ridge waveguide structure 9 on the side surfaces, wherein material mixing can be problematic with higher laser powers, especially with conventional laser diodes. Such an interfacial mixing, in conventional laser diodes between the semiconductor material and the dielectric of the passivation, can lead to the Group V component of laser diodes based on III-V compound semiconductor materials being volatile, resulting in absorption centers. These in turn lead to a loss of efficiency and increased degradation rates.

Furthermore, the first layer 11 can form a particularly effective barrier against leakage currents. As an alternative to AlN, the first layer can also comprise AlGaN or a layer stack with several layers. In addition, further layers or layer stacks can be applied to the layers shown to form the passivation layer 10.

Figure 9:
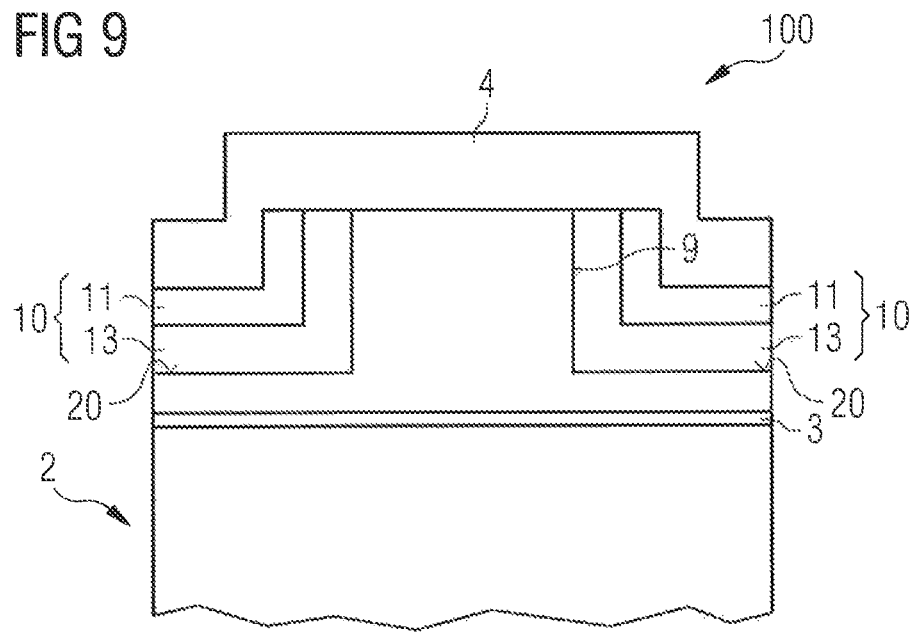

FIG. 9 shows an embodiment of a semiconductor laser diode 100 in which the passivation layer 10 comprises or is made of a layer stack 13, for example an AlN/GaN layer stack as described in conjunction with FIGS. 3 and 4, and a layer 11 with or preferably made of AlN. This allows a separation of the wave guidance function, achieved by the layer stack 13, from the diffusion barrier function, especially at the interface to the electrode layer 4. Alternatively, the layer stack 13 can also be an AlGaN/AlN laminate or a GaN/AlGaN laminate. Layer 11 can alternatively also be with or made of AlGaN or with or made of an AlN/AlGaN laminate. Optionally, to form the passivation layer 10, further layers can be applied above, between or below the layers shown. Furthermore, waveguiding via a GaN waveguide is also possible as an option, especially when the full-surface waveguide arranged underneath in the semiconductor layer sequence 2 comprises or is made of InGaN.

Figure 10:
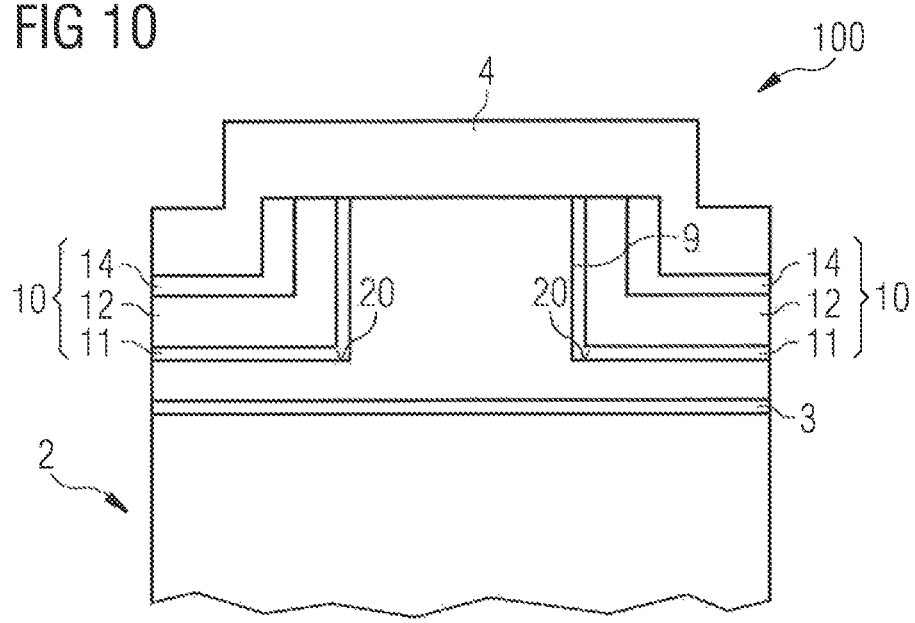

The semiconductor laser diode 100 according to the embodiment in FIG. 10 comprises as passivation layer 10 a multilayer system which, like previous embodiments, enables efficient decoupling of the electrical and optical guidance. The passivation layer 10 has a first layer 11 with or made of GaN. The non-conductive GaN layer 11 prevents current expansion, but is also suitable for optical wave propagation. A second layer 12 with or made of AlGaN is applied to this, which can be embodied as described in FIG. 7. Alternatively, instead of the second layer 12, there can also be a layer stack, for example, as described in connection with FIGS. 3 and 4. An optical waveguide can be achieved by the second layer 12. On the second layer 12, a third layer 14 is optionally applied, which can be, for example, with or made of AlN and which can form an efficient barrier against leakage currents and/or an efficient diffusion barrier.

Figure 11:
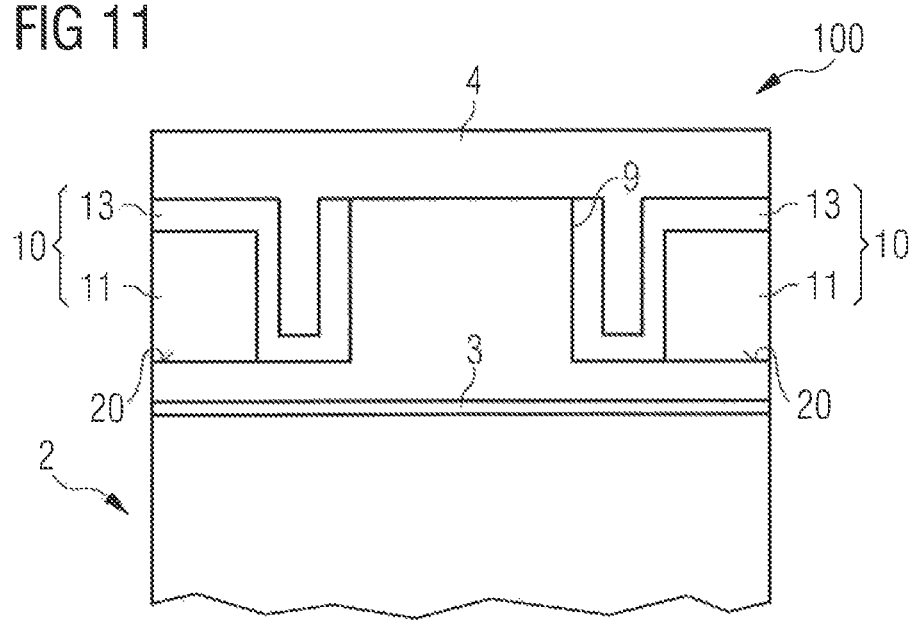

FIG. 11 shows an embodiment of a semiconductor laser diode 100 in which the passivation layer 10, in particular a first layer 11, together with the ridge waveguide structure 9 forms trenches next to the ridge waveguide structure 9, and the trenches are covered by a layer stack 13 of the passivation layer 10 and at least partially filled. In particular, the passivation layer 10 has on both sides beside the ridge waveguide structure 9 a first layer 11 with or made of AlN, which is spaced from the ridge waveguide structure 9. The first layer 11, the trench between the first layer 11 and the ridge waveguide structure 9 as well as the side surfaces of the ridge waveguide structure 9 are overmolded with the layer stack 13, which can be formed, for example, as described in connection with FIGS. 3 and 4. Alternatively, an AlGaN layer can be applied instead of layer stack 13.

The passivation layer 10 together with the ridge waveguide structure 9 forms a so-called tripod structure as already described above in connection with FIG. 1D, which can provide good protection of the ridge waveguide structure 9 against damage, for example, during manufacture, assembly and operation of the semiconductor laser diode 100. Furthermore, good mountability can be achieved with the electrode layer 4 on a heat sink, wherein in particular the first layer 11 can lead to good heat dissipation, while the waveguide properties can be adjusted by the layer stack 13.

FIGS. 12A and 12B show sectional views of a semiconductor laser diode 100 according to a further embodiment, wherein FIG. 12A shows the semiconductor laser diode 100 at the center of the resonator, while FIG. 12B shows the semiconductor laser diode 100 near one or both facets, in particular near the light-outcoupling surface. As can easily be seen, the composition of the passivation layer 10 varies along the longitudinal direction, i.e., along the resonator, with regard to the layer and material composition. Near the facet(s), the passivation layer 10 has a first layer 11 with or made of GaN, on which a layer stack 13 is applied, for example, according to one of the embodiments of FIGS. 3 and 4, while the first layer 11 is not present in the region of the resonator center. The first layer 11 is thus only partially applied along the resonator. Such a varying layer composition along the ridge waveguide structure 9 can be achieved, for example, by mask technologies in connection with atomic layer deposition. The additional first layer 11 close to one or both facets can, for example, achieve a widening of the optical mode, thus increasing the facet load. Since such a near-facetted region is usually unpowered, it can be possible that no current is lost that does not contribute to the inversion of the population in the resonator. Furthermore, it can also be possible that the first layer is 11 with or without AlN. This allows improved heat dissipation in the vicinity of the facet, which also increases the facet load.

Figure 13A:
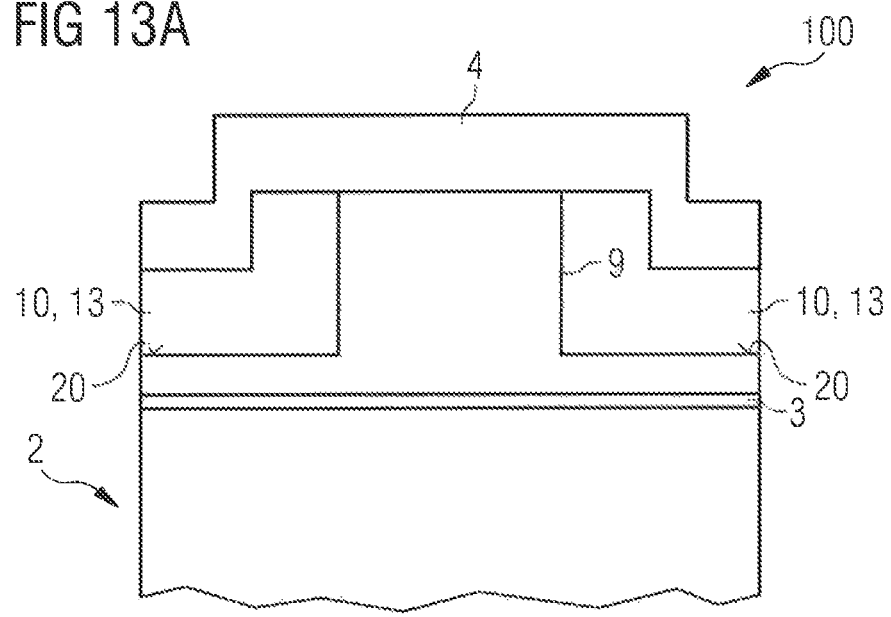
Figure 13B:
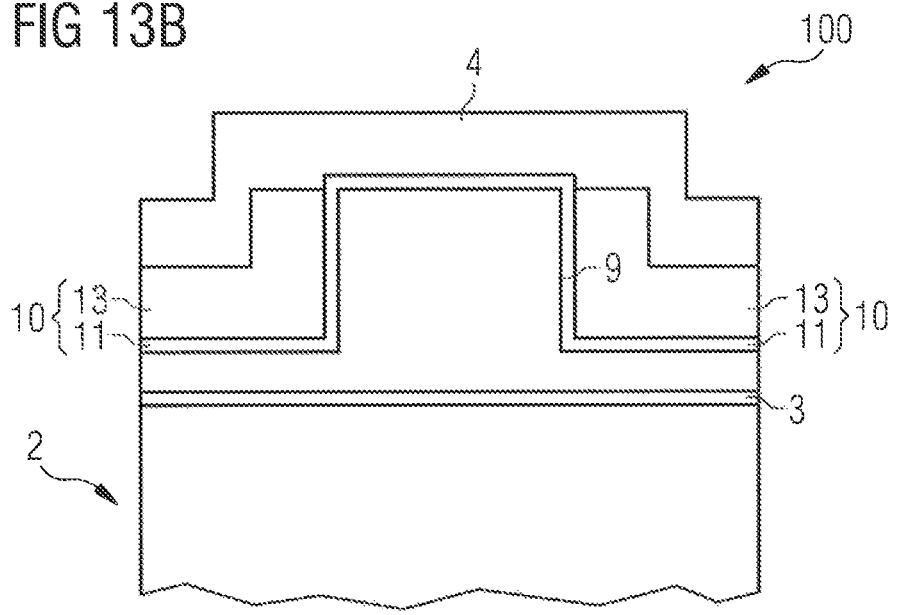

FIGS. 13A and 13B also show sectional views of a semiconductor laser diode 100 according to a further embodiment, corresponding to the sectional views of FIGS. 12A and 12B. In contrast to the previous embodiment, the electrically insulating first layer 11, which in turn can comprise or be GaN or preferably AlN, extends in the near-facet region additionally over the ridge waveguide structure 9, so that a current supply to the ridge waveguide structure 9 in the near-facet region can be prevented in particular by the first layer 11. This makes it possible to counteract facet heating even more efficiently, so that the facet load can be further increased. Furthermore, it can also be possible to achieve additional cooling of the laser facet by means of a single or multi-layer passivation layer applied partially in the facet region by atomic layer deposition.

The embodiments and features shown in the Figures are not limited to the respective combinations shown in the Figures. Rather, the shown embodiments as well as single features can be combined with one another, even if not all combinations are explicitly described. In addition, the embodiments described in connection with the Figures may have alternative or additional features according to the description in the general part.

The invention is not limited by the description based on the embodiments to these embodiments. Rather, the invention includes each new feature and each combination of features, which includes in particular each combination of features in the patent claims, even if this feature or this combination itself is not explicitly explained in the patent claims or embodiments.

The invention claimed is:

1. A semiconductor laser diode comprising:
an epitaxially produced semiconductor layer sequence comprising at least one active layer; and
a gallium-containing passivation layer on at least one surface region of the semiconductor layer sequence,
wherein the passivation layer comprises at least one layer with AlGaN, and
wherein a composition of the AlGaN varies over a thickness of the passivation layer.

2. The semiconductor laser diode according to claim 1, wherein the passivation layer comprises a layer stack with at least one layer with GaN and at least one layer with AlN.

3. The semiconductor laser diode according to claim 1, wherein the passivation layer comprises at least two layers with the same material having different thicknesses.

4. The semiconductor laser diode according to claim 1, wherein the semiconductor layer sequence has a ridge waveguide structure with a ridge having ridge side surfaces, and wherein the surface region comprises at least one ridge side surface.

5. The semiconductor laser diode according to claim 4, wherein the passivation layer at least partially planarizes the ridge waveguide structure.

6. The semiconductor laser diode according to claim 4, wherein the passivation layer comprises at least a first layer formed laterally beside the ridge waveguide structure and spaced apart from the ridge waveguide structure, and wherein the first layer, a trench between the first layer and the ridge waveguide structure, and a side surface of the ridge waveguide structure is covered with a second layer.

7. The semiconductor laser diode according to claim 1, wherein the passivation layer has a varying layer composition and/or a varying material composition along an emission direction of the semiconductor laser diode.

8. The semiconductor laser diode according to claim 1, wherein the passivation layer is transparent and electrically insulating.

9. The semiconductor laser diode according to claim 1, wherein the passivation layer has a lower crystallinity than all semiconductor layers of the semiconductor layer sequence.

10. The semiconductor laser diode according to claim 1, wherein the passivation layer has a partially crystalline or amorphous crystal structure.

11. The semiconductor laser diode according to claim 1, wherein the passivation layer and the semiconductor layer sequence comprise materials selected from the same III-V compound semiconductor material system.

12. The semiconductor laser diode according to claim 1, wherein the passivation layer comprises a nitride.

13. The semiconductor laser diode according to claim 1, wherein the passivation layer comprises at least one layer with GaN.

14. The semiconductor laser diode according to claim 1, wherein the passivation layer comprises at least one layer with AlN.

15. The semiconductor laser diode according to claim 1, further comprising an electrode layer arranged on the passivation layer.

16. The semiconductor laser diode according to claim 15, wherein the passivation layer has a layer comprising GaN or AlGaN adjacent to the electrode layer.

17. A method for manufacturing the semiconductor laser diode according to claim 1, the method comprising:
providing the semiconductor layer sequence; and
depositing the gallium-containing passivation layer on the at least one surface region of the semiconductor layer sequence by an atomic layer deposition.

18. A semiconductor laser diode comprising:
an epitaxially produced semiconductor layer sequence comprising at least one active layer; and
a gallium-containing passivation layer disposed on at least one surface region of the semiconductor layer sequence,
wherein the passivation layer has a lower crystallinity than all semiconductor layers of the semiconductor layer sequence.

19. A semiconductor laser diode comprising:
an epitaxially produced semiconductor layer sequence comprising at least one active layer; and
a gallium-containing passivation layer on at least one surface region of the semiconductor layer sequence,
wherein the passivation layer has a partial crystalline structure or amorphous crystal structure.

20. The semiconductor laser diode according to claim 19, wherein the passivation layer is transparent and electrically insulating.

21. The semiconductor laser diode according to claim 19, further comprising an electrode layer arranged on the passivation layer.

* * * * *